United States Patent
Thomas (10) Patent No.: US 11,764,110 B2
(45) Date of Patent: Sep. 19, 2023

(54) MOAT COVERAGE WITH DIELECTRIC FILM FOR DEVICE PASSIVATION AND SINGULATION

(71) Applicant: SEMICONDUCTOR COMPONENTS INDUSTRIES, LLC, Phoenix, AZ (US)

(72) Inventor: Mark Anand Thomas, Seremban (MY)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 421 days.

(21) Appl. No.: 16/862,015

(22) Filed: Apr. 29, 2020

(65) Prior Publication Data

US 2021/0343594 A1 Nov. 4, 2021

(51) Int. Cl.
*H01L 23/48* (2006.01)
*H01L 21/784* (2006.01)
*H01L 23/31* (2006.01)
*H01L 23/00* (2006.01)
H01L 23/29 (2006.01)
H01L 21/311 (2006.01)

(52) U.S. Cl.
CPC ........ *H01L 21/784* (2013.01); *H01L 23/3171* (2013.01); *H01L 23/3192* (2013.01); *H01L 24/03* (2013.01); *H01L 24/05* (2013.01); *H01L 21/31144* (2013.01); *H01L 23/291* (2013.01); *H01L 2224/02181* (2013.01); *H01L 2224/03466* (2013.01); *H01L 2224/03831* (2013.01); *H01L 2224/05573* (2013.01)

(58) Field of Classification Search
CPC ............. H01L 24/03–10; H01L 23/191; H01L 2224/02181–05573
See application file for complete search history.

(56) References Cited

U.S. PATENT DOCUMENTS

| | | | | |
|---|---|---|---|---|
| 3,769,562 A | * | 10/1973 | Bean | H01L 21/00 148/DIG. 135 |
| 3,973,270 A | * | 8/1976 | Schroder | H01J 29/39 313/367 |
| 5,093,283 A | * | 3/1992 | Rowe | H01L 21/56 438/421 |
| 2002/0163059 A1 | * | 11/2002 | Hamerski | H01L 21/02576 257/E21.101 |
| 2005/0012183 A1 | * | 1/2005 | Chow | H01L 24/97 257/E23.042 |
| 2016/0118490 A1 | * | 4/2016 | Padmanabhan | H01L 27/0629 257/195 |
| 2017/0077082 A1 | * | 3/2017 | Marreiro | H01L 27/0255 |

OTHER PUBLICATIONS

Fairchild Semiconductor Corporation, "PCN#: P544AAB", May 15, 2015.

* cited by examiner

Primary Examiner — Hoa B Trinh
(74) Attorney, Agent, or Firm — Brake Hughes Bellermann LLP (57) ABSTRACT

Techniques are described for the use of moats for isolating and singulating semiconductor devices formed on a wafer. Described techniques use dielectric films, such as an oxide-nitride film, to coat moat surfaces and provide passivation. The dielectric films may form a junction with a metal contact layer, to reduce electrical overstress that may otherwise occur in the resulting semiconductor devices. To ensure coverage of the moat surfaces, spray coating of a positive photoresist may be used.

19 Claims, 8 Drawing Sheets

MOAT COVERAGE WITH DIELECTRIC FILM FOR DEVICE PASSIVATION AND SINGULATION

TECHNICAL FIELD

This description relates to semiconductor device passivation and singulation techniques.

BACKGROUND

Semiconductor devices are typically formed on a wafer, such as a Silicon (Si) wafer. Many of a particular type of device may be formed on a wafer, and then the wafer may be cut or otherwise divided into individual devices. For example, moats may be defined within a wafer and between semiconductor devices, in order to provide device isolation and/or to define cutting lines used to cut the wafer into individual devices.

For many types of semiconductor devices, unwanted leakage currents may occur, and it is possible to use a passivation layer to minimize or eliminate such leakage currents. For example, photo-glass passivation (PGP) may be used to form photo-glass in wafer areas requiring passivation, which may include wafer areas in and around moats. Unfortunately, such passivation films typically introduce difficulties in wafer processing (including, e.g., wafer cutting) and consume valuable surface area on the wafer.

SUMMARY

According to on general aspect, a semiconductor device assembly includes a substrate having a semiconductor device formed therein, and a moat portion formed in the substrate with a sidewall that is adjacent to the semiconductor device and contiguous with a surface of the substrate. The semiconductor device assembly further includes a dielectric film covering the sidewall and a first portion of the surface, and a metal contact layer covering a second portion of the surface and at least a portion of the dielectric film covering the first portion of the surface, and providing electrical contact to the semiconductor device.

According to another general aspect, a semiconductor wafer assembly includes a substrate having a plurality of semiconductor devices formed therein, and at least one moat formed in the substrate and dividing the plurality of semiconductor devices into individual semiconductor devices, the at least one moat having moat sidewalls that are adjacent to at least two of the individual semiconductor devices, and a moat bottom between the sidewalls. The semiconductor wafer assembly further includes a dielectric film covering the moat sidewalls, the moat bottom, and a portion of a surface of the substrate on a top perimeter of the moat.

According to another general aspect, a method of manufacturing a semiconductor device includes forming at least one moat within a substrate having a plurality of semiconductor devices formed therein, the at least one moat dividing the plurality of semiconductor devices into individual semiconductor devices, and including moat sidewalls that are adjacent to at least two of the individual semiconductor devices, and a moat bottom between the sidewalls. The method further includes forming a dielectric film covering the moat sidewalls, the moat bottom, and a portion of a surface of the substrate on both sides of the moat.

The details of one or more implementations are set forth in the accompanying drawings and the description below. Other features will be apparent from the description and drawings, and from the claims.

DETAILED DESCRIPTION

As referenced above, moats may be used for isolating, dividing, cutting, dicing, and/or singulating semiconductor devices formed on a wafer. Such moats, which can be defined in a cross-hatch pattern on a surface of a wafer, typically require passivation to ensure low leakage performance, but existing passivation techniques suffer from a number of difficulties. For example, photo-glass passivation (PGP) may be used to cap moat sidewalls for passivation, but PGP is susceptible to various types of defects and damage, subject to disadvantageous processing requirements, and requires excessive wafer area to implement.

The present description provides techniques for using a dielectric film, such as an oxide-nitride film, to coat moat surfaces and provide passivation. Such oxide-nitride films, or similar dielectric films, provide the same or better passivation than PGP, while consuming less wafer area. Moreover, the described passivation using dielectric films enables more complete coverage of the wafer surface, thereby potentially reducing the possibility of electrical overstress (EOS) that may otherwise occur at exposed surface areas.

The resulting passivated moats may be cut to separate semiconductor devices, without damage to the dielectric film, or to the surrounding substrate or devices. Similarly, associated processing steps (e.g., soldering, assembly clip bonding, or molding processes) may be executed, without inadvertently damaging the dielectric film or otherwise reducing the provided passivation. Further, as the dielectric films described herein may require less space than existing passivation materials, such as PGP, it is possible that more devices may be included on a semiconductor wafer than with existing techniques.

Figure 1:
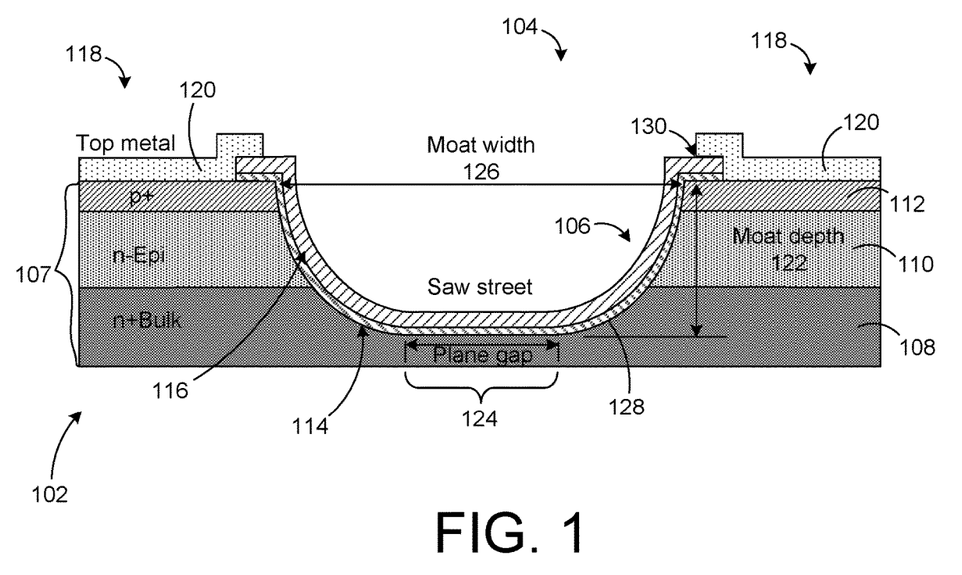
FIG. 1 is a cross section of an example implementation of a semiconductor wafer including a moat with a dielectric film.

FIG. 1 is a cross section of an example implementation of a semiconductor wafer including a moat with a dielectric film. In the example of FIG. 1, a substrate 102 is illustrated as including a moat 104. As shown, a dielectric film 106 is disposed within the moat 104.

In the example of FIG. 1, the substrate 102 includes a plurality of semiconductor devices, represented by an ultrafast rectifier 107 that is comprised of multiple layers 108, 110, 112. As shown, the layers 108, 110, 112 may be defined by different doping types and profiles. For example, the layer 108 may be a bulk layer (e.g., n+), layer 110 may be an epitaxial layer (e.g., n-type), and layer 112 may be a doped layer of opposite type than the bulk and epitaxial layers (e.g., a p+ layer). Although not explicitly illustrated in FIG. 1, a cathode for the formed ultrafast rectifier(s) 107 may be connected to the bulk layer 108.

The dielectric film 106 in FIG. 1 is illustrated as including an oxide layer 114 and a nitride layer 116, which may be referred to in the aggregate as an oxide-nitride layer. In different implementations, the dielectric film 106 may be implemented using any suitable dielectric material that provides desired levels of passivation. For example, Semi-Insulating Polycrystalline Silicon (SIPOS), Silicon Rich Nitride, Amorphous Silicon or Alpha Silicon may be used. When two or more dielectric films are used together, then a suitable order may be selected. For example, in FIG. 1 the oxide film 114 is illustrated as being deposited prior to the nitride film 116, but this order may be reversed (as in the examples of FIGS. 2-8, below).

Bond pad areas 118 are thus defined on either side of the moat 104, which may be used to provide electrical contact for included types of semiconductor devices. In the example of FIG. 1, the bond pad areas 118 are illustrated as including a top metal layer 120. For example, a Titanium/Nickel/Silver layer may be used. As shown, and as discussed in more detail, below, the top metal layer 120 may extend over the bond pad areas 118, and onto at least a portion of the dielectric film 106. Thus, the dielectric film 106 may be formed as covering the moat sidewalls, the moat bottom, and a portion of a surface of the substrate on a top perimeter of the moat 104.

Further in FIG. 1, various example device parameters are defined, for ease of reference and explanation. For example, a moat depth 122 is defined between the substrate surface and a moat surface deepest within the substrate 102, as shown. The latter moat surface may have at least a portion that is substantially planar, and that is also referred to separately as a plane gap 124. This plane gap 124 may also be referred to as a saw street, with reference, e.g., to its use in providing a cutting line for a dicing saw. A moat width 126 is defined between points on the substrate surface traversing the moat 104.

As shown in FIG. 1, and discussed in detail below, a moat surface 128 may be completely and sufficiently covered by the dielectric film 106. In particular, the corners of the moat at each end of the moat width 126 are covered, and the dielectric film 106 may extend to cover at least a portion of the adjacent surface of the substrate 102, as well.

As further illustrated, the edge of the top metal layer 120, labelled as 130, may overlay the dielectric film 106. This approach enables avoiding any exposed substrate surface between the top metal layer 120 and the dielectric film 106.

As referenced above, implementations of FIG. 1 provide a number of advantages over existing moat passivation techniques, as described in more detail below with respect to the specific example of PGP. For example, PGP, as a glass material, is susceptible to cracking and other physical damage. PGP consumes more volume within and around a moat than the dielectric film 106, including potentially protruding upwards beyond an edge of a moat (thereby making the PGP susceptible to damage during subsequent solder, assembly, and molding processes). In contrast, as shown in FIG. 1, the dielectric film 106 provides a thin but thorough covering of an entire moat surface 128 and adjacent substrate surfaces, as well.

Also due to the potential for PGP cracking, it is not desirable to attempt to cut through PGP. As a result, a saw street region in a PGP implementation (analogous to the saw street 124) typically leaves an underlying substrate surface exposed for cutting. In contrast, the dielectric film 106 may easily be cut by a saw or other cutting technique, without requiring exposed substrate surfaces within the moat 104.

When using PGP, substrate surfaces may also be exposed between the PGP and bond pad areas on either side of a moat where devices are formed/connected. As a result, electrical over-stress (EOS) failures may occur in these regions. In contrast, as discussed above and illustrated in FIG. 1, the metal overlay 130 ensures complete coverage of the underlying substrate surface(s).

Further, as also referenced above, implementations of FIG. 1 enable smaller spacing between individual semiconductor devices (e.g., between dies), which provides a resulting die/wafer increase and/or associated lowering of substrate (e.g., Silicon) cost. For example, PGP consumes more area than the dielectric film 106, is subject to lateral expansion, and requires leaving exposed substrate surfaces as referenced above. As a result, substrate space between devices on conventional wafers may be in a range of 400 microns or more. In contrast, implementations of FIG. 1 may be manufactured with substrate space between devices in a much smaller range of less than 300 microns or less than 200 microns, e.g., 160 microns. Accordingly, an increase in die/wafer may be obtained, without requiring any changes to the device active area(s).

For example, depending on wafer/die sizes being used, conventional PGP implementations may have a moat width (corresponding to the moat width 126) of 250-600 microns or more, while the moat width 126 of FIG. 1 for corresponding wafer/die sizes may be in a range of, e.g., 150-300 microns. Conventional PGP implementations may have a plane gap (corresponding to the plane gap 124) of 150-350 microns or more, while the plane gap 124 of FIG. 1 for corresponding wafer/die sizes may be maintained at less than 100 microns, e.g., 75 microns. Meanwhile, a moat depth 122 may be maintained to be the same or similar as in PGP implementations (e.g., in a range of 100 microns, e.g., 110 microns).

Thus, area increases of, e.g., 10%, 20%, or 30% may be obtained, depending on which size wafer is being compared and other factors, which may be used to include more and/or different devices on a given wafer. A higher yield of such devices may thus be obtained, thereby providing greater reliability and efficiency in the manufacturing process.

Additionally, the various dielectric film materials used to form the dielectric layer 106 may provide improved passivation as compared to PGP, resulting in higher probe and final test yields, as well as increases in reliability due to increased abilities to withstand electrical over-stress conditions that may occur. In a specific example, when the substrate 102 is a Silicon substrate, including a nitride layer prevents migration of $Na^+$ ions to the Silicon surface, which may otherwise cause high-temperature reverse bias (HTRB) failures when the semiconductor devices being constructed include diodes or other biased devices.

Figure 10:
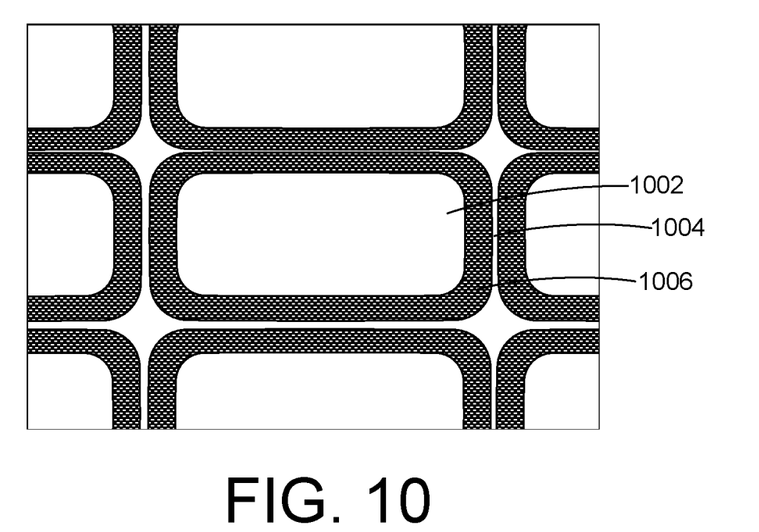
FIG. 10 is a top view of the example implementation of FIG. 1.
Figure 12:
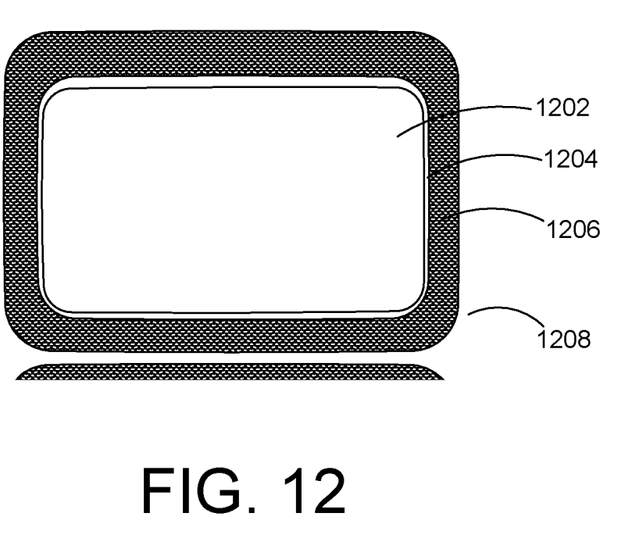
FIG. 12 is a top view of a semiconductor die following etching.

Thus FIG. 1 illustrates a substrate, such as a wafer, having a plurality of semiconductor devices formed therein. That is, although FIG. 1 is a cross section illustrating only two semiconductor devices, the top views of FIGS. 10 and 12 illustrate that the moat 104 represents at least one moat formed in the substrate and dividing a plurality of semiconductor devices into individual semiconductor devices. As shown, the at least one moat 104 has moat sidewalls that are adjacent to at least two of the individual semiconductor devices, and a moat bottom (e.g., the plane gap, or saw street, 124) between the sidewalls. The dielectric film 106 covers the moat sidewalls, the moat bottom, and a portion of a surface of the substrate on both sides of the moat. Specifically, as shown and described, the metal contact layer 120 covers a remaining portion of the surface of the substrate and at least a portion of the dielectric film 106 covering the portion of the surface of the substrate, and provides electrical contact to the underlying semiconductor device(s) 107.

Figure 8:
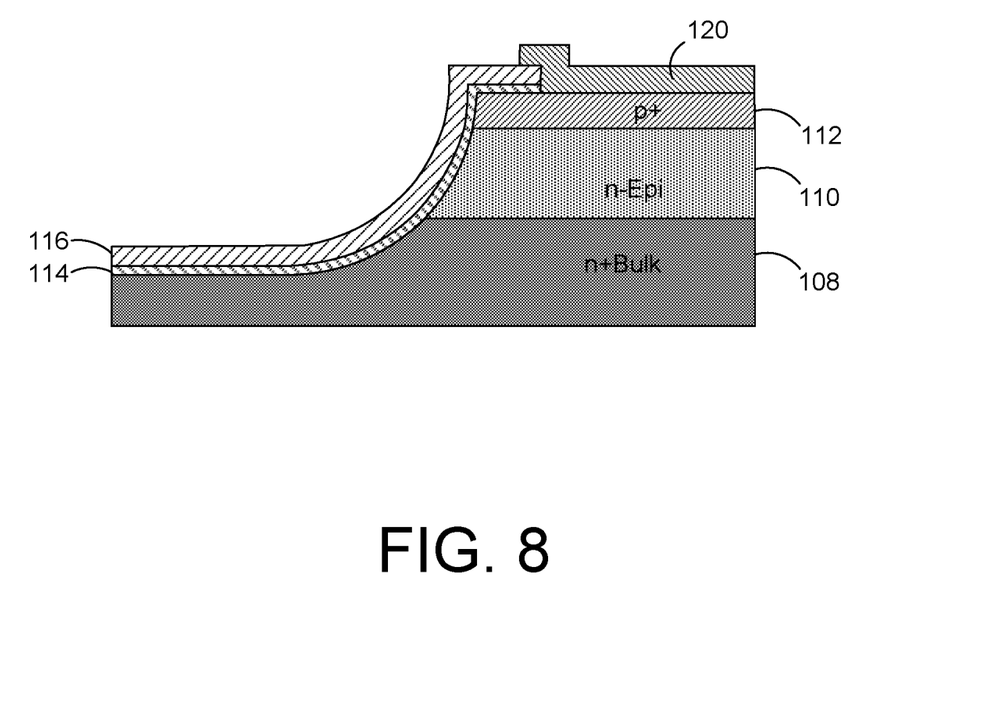
FIG. 8 is a cross-section of a seventh example process for forming the example implementation of FIG. 1.
Figure 9:
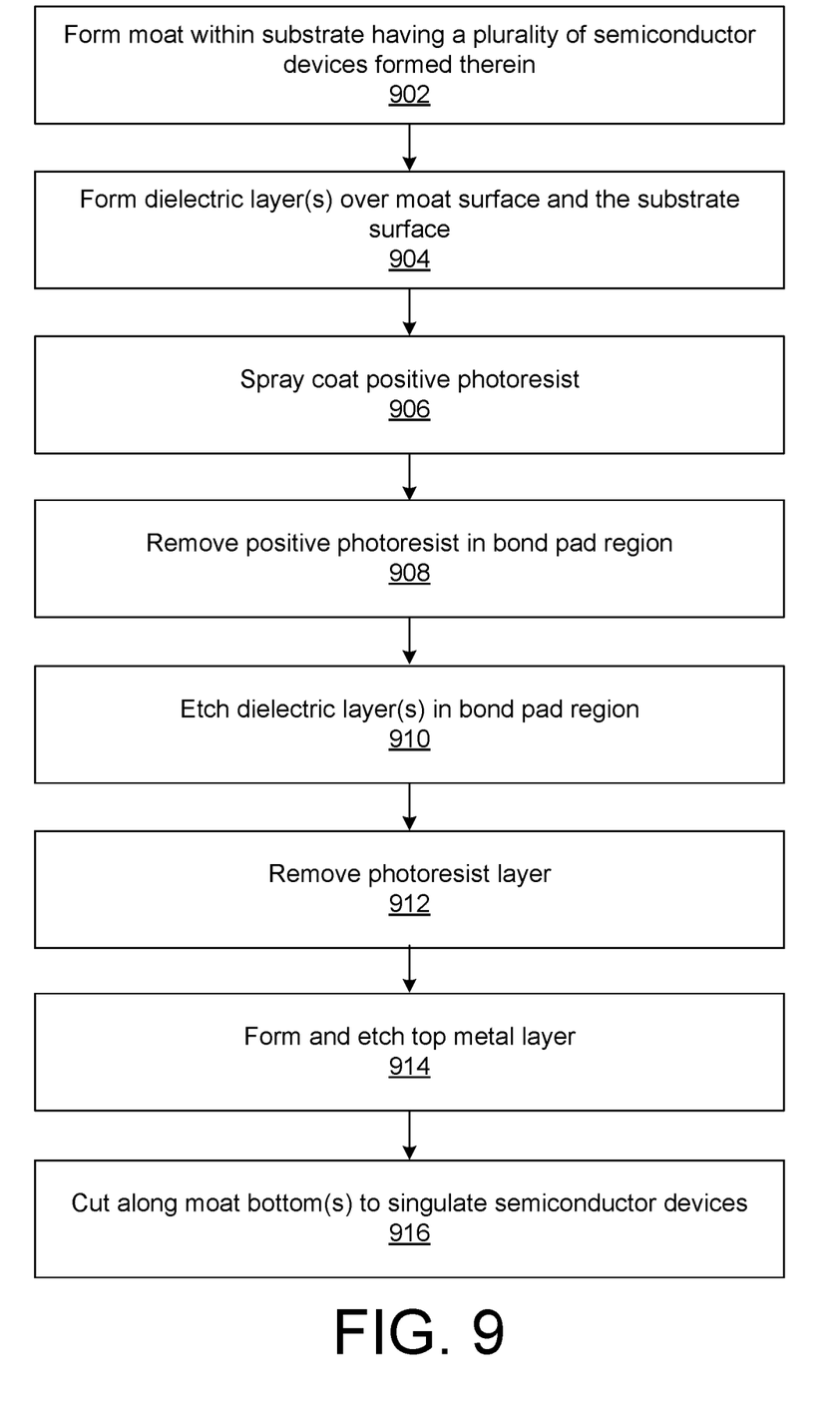
FIG. 9 is a flowchart illustrating example process steps corresponding to the examples of FIGS. 1-8.

FIGS. 2-8 illustrate cross-sections of example processes for forming the example implementation of FIG. 1, and are described below with respect to the corresponding flowchart of FIG. 9.

Figure 2:
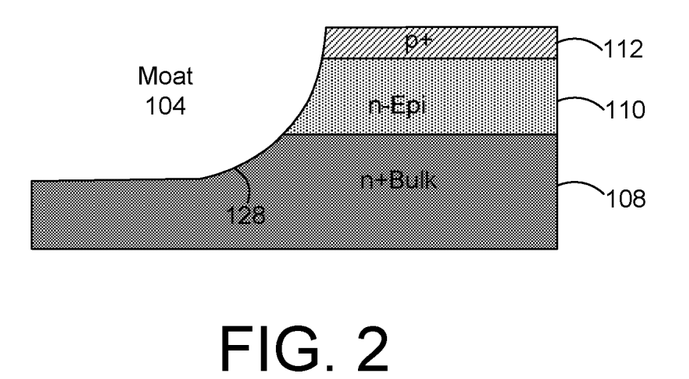
FIG. 2 is a cross-section of a first example process for forming the example implementation of FIG. 1.

In FIG. 2, a moat is formed within a substrate having a plurality of semiconductor devices formed therein (902). For example, as shown, the moat 104 may be formed with respect to doped layers 108, 110, 112 that form ultrafast rectifier(s) 107. The moat 104 may be etched using a mask and negative photoresist.

Figure 3:
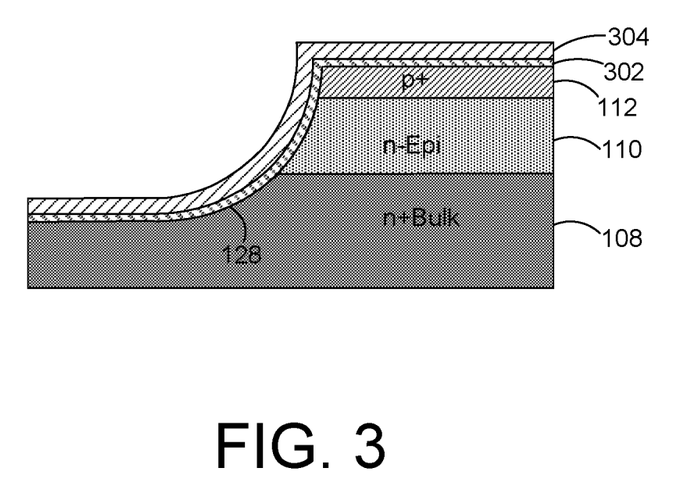
FIG. 3 is a cross-section of a second example process for forming the example implementation of FIG. 1.

In FIG. 3, a dielectric layer may be formed over the moat surface and the substrate surface (904). For example, as shown, a nitride layer 302 may be deposited using low pressure chemical vapor deposition (LPCVD), e.g., a 1.35 kA layer. Then, a Silicon Oxide (SiO2) layer 304 may be deposited, e.g., a 9 kA layer, using plasma-enhanced CVD (PECVD), and followed by an oxide annealing process. In other example implementations, a Silicon Oxide (SiO2) layer may be deposited first, using PECVD, and followed by an oxide annealing process, and then a nitride layer may be deposited using a LPCVD process.

Figure 4:
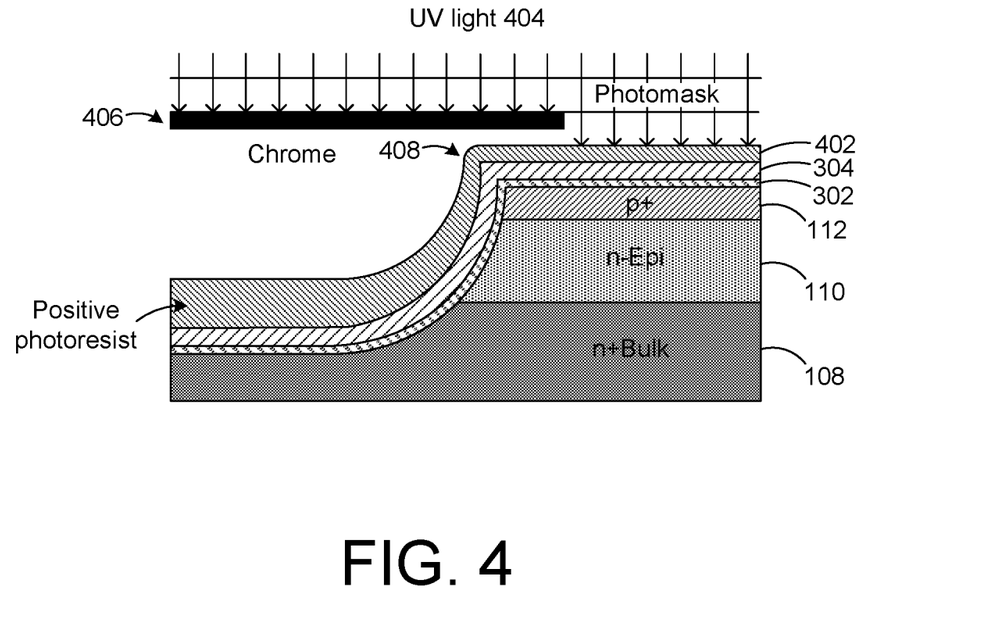
FIG. 4 is a cross-section of a third example process for forming the example implementation of FIG. 1.
Figure 5:
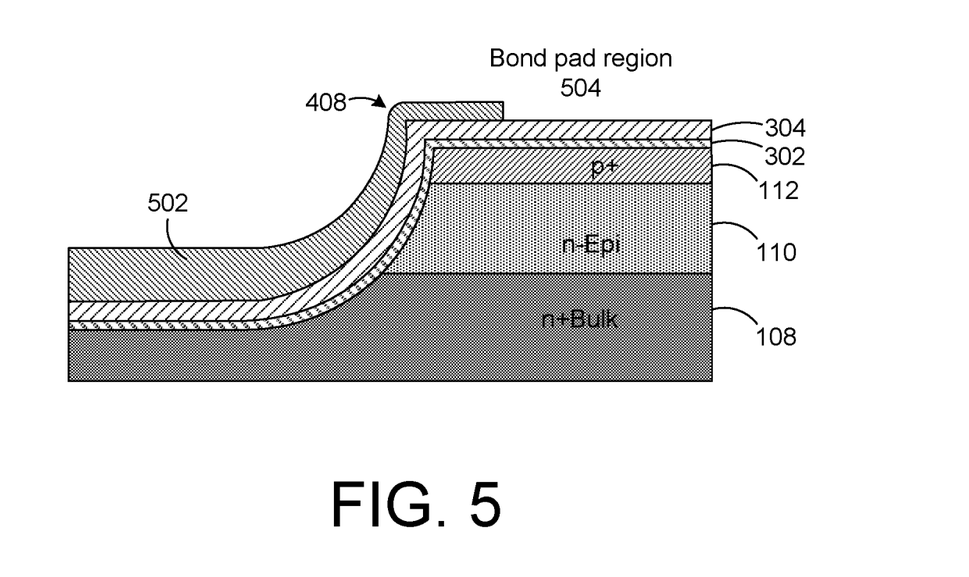
FIG. 5 is a cross-section of a fourth example process for forming the example implementation of FIG. 1.

In FIGS. 4 and 5, a positive photoresist 402 is deposited using spray coating (906). UV light 404 and photomask 406 are used to perform selective ultraviolet (UV) exposure of the positive photoresist. This is followed by a develop step to remove the positive photoresist in a bond pad region 504 (908), leaving remaining photoresist 502. Through the use of spray coating, as opposed to other techniques (such as spin coating, typically used for PGP), coverage is ensured for all of the moat surface 128 and onto the substrate surface. In particular, coverage is provided at a corner 408 corresponding to a sharp moat edge. Moreover, through the use of positive photoresist 402, it is not necessary to expose sidewall surfaces of the moat 104 to UV light (where UV light exposure on such sidewall surfaces may be difficult due to the curved nature of the sidewall surfaces of the moat 104).

Figure 6:
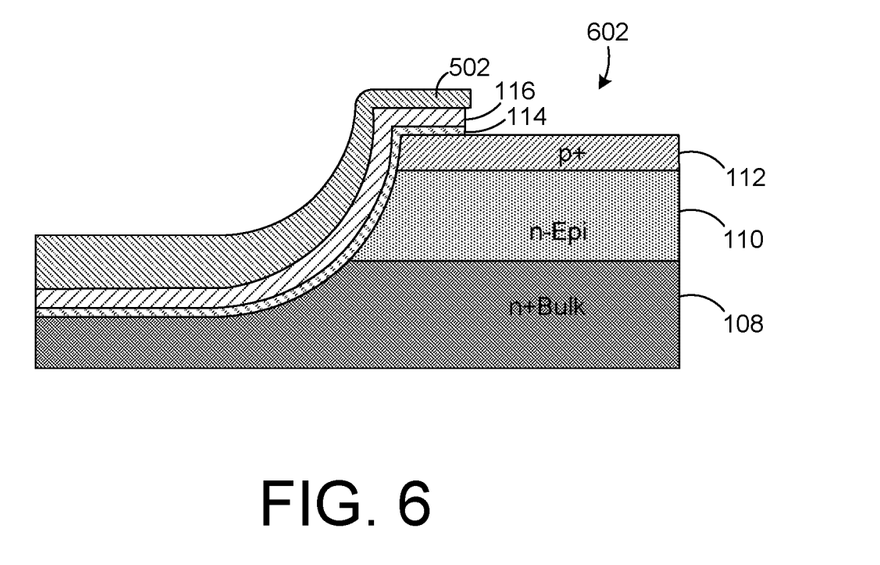
FIG. 6 is a cross-section of a fifth example process for forming the example implementation of FIG. 1.
Figure 7:
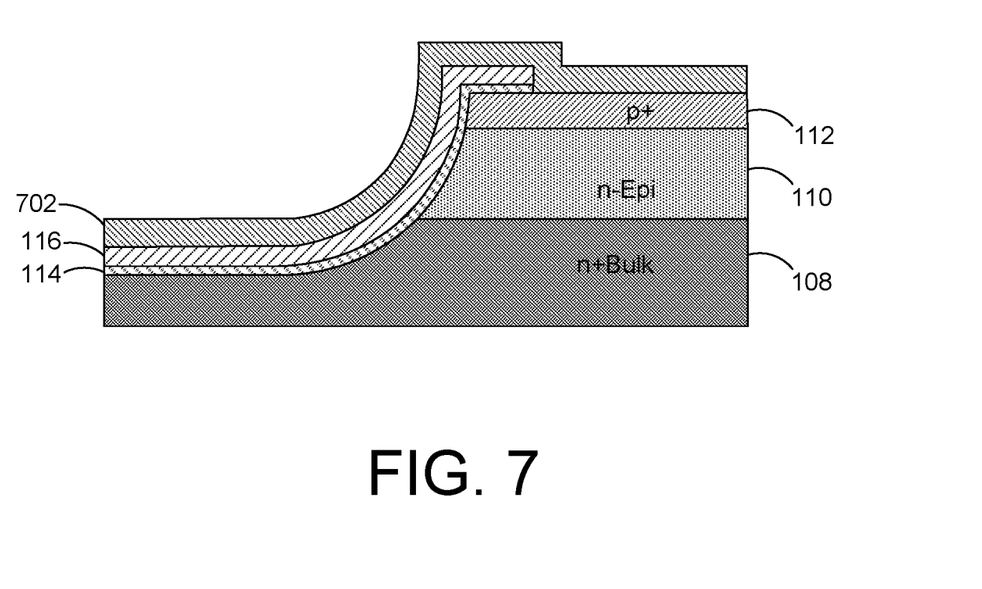
FIG. 7 is a cross-section of a sixth example process for forming the example implementation of FIG. 1.

In FIG. 6, a portion of the dielectric layer 302/304 of FIG. 5 not covered with photoresist 502 may be etched off to expose the bond pad region of FIG. 1 (910).

The photoresist layer 502 in FIG. 6 is removed, e.g., by plasma ashing (912). Further, top metal layer 702 is formed in FIG. 7 and selectively etched off in the moat region in FIG. 8. The remaining top metal layer is shown in FIG. 8 (914). A negative photoresist may be used to protect the metal layer 120 in the bond pad region in FIG. 8 from being etched.

Although FIGS. 2-8 illustrate an individual device, and associated manufacture, the described methods are performed on a wafer level. That is, as shown in FIG. 1, and illustrated in the top views of FIGS. 10 and 12, a plurality of semiconductor devices, e.g., semiconductor devices 107, are formed on a wafer and isolated by moats, such as the moat 104, using the processes described with respect to FIGS. 2-8. Then, cutting along the moat bottoms may proceed in order to singulate individual semiconductor devices (916).

In this regard, the example of FIG. 8 may be understood to represent a resulting, individual semiconductor device, which may be subject to further processing and packaging. As shown, the resulting, individual semiconductor device generally includes a substrate having a semiconductor device formed therein, and a moat portion remaining after the cutting of the moat 104. The moat portion is thus formed in the substrate with a sidewall that is adjacent to the semiconductor device and contiguous with a surface of the substrate, as shown. The dielectric film 106 covers the sidewall and a first portion of the surface, as shown and described. The metal contact layer 120 covers a second portion of the surface and at least a portion of the dielectric film 106 (e.g., 116) covering the first portion of the surface, and provides electrical contact to the semiconductor device.

FIG. 10 is a top view of the example implementation of FIG. 1. In FIG. 10, a die 1002 represents an instance of the semiconductor device 107 of FIG. 1, illustrated following the spray coating of the photoresist 402. In FIG. 10, area 1006 illustrates a photoresist-coated moat sidewall, while area 1004 represents a photoresist coated moat bottom. Thus, FIG. 10 illustrates a wafer-level top view in which a plurality of semiconductor devices may be isolated by a pattern of moats used for singulating the plurality of semiconductor devices, as described herein.

Figure 11:
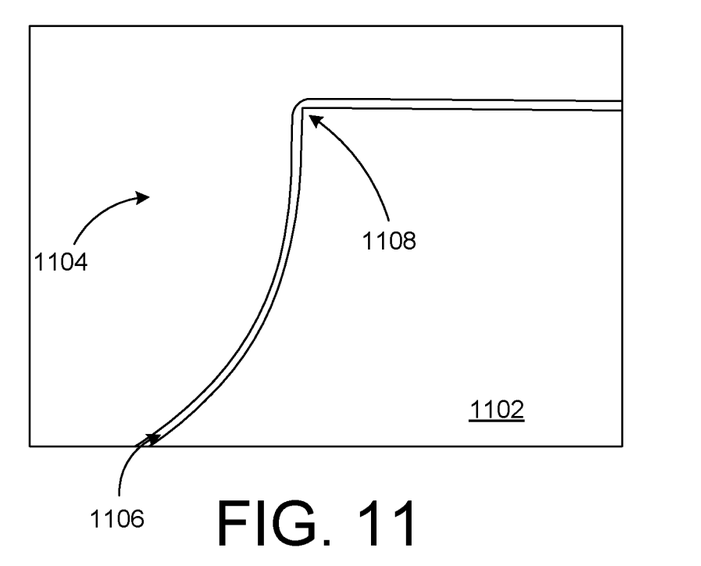
FIG. 11 is a cross section view of the example implementation of FIG. 10.

FIG. 11 is a cross section view of the example implementation of FIG. 10. FIG. 11 illustrates that a substrate 1102 adjacent to a moat portion 1104 may have sufficient levels of coverage of photoresist 1106, even at a moat corner 1108. For example, photoresist thickness may be in a range of less than a few microns, e.g., less than 1.5 microns, and the thickness at the moat corner 1108 may be at least 45% of the thickest portion of the photoresist, e.g., 70-90% or more.

FIG. 12 is a top view of a semiconductor die following etching. Following the etching of the dielectric layers 114/116 of FIG. 6 in the bond pad region 1202, the substrate is exposed for the top metal layer 120 to make an electrical contact. Regions 1204, 1206 and 1208 in FIG. 12 will be fully covered with the dielectric layers 114/116.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device assembly, comprising:
   a substrate having a semiconductor device formed therein;
   a moat portion formed in the substrate with a sidewall that is adjacent to the semiconductor device and contiguous with a surface of the substrate, and with a moat bottom contiguous with the sidewall;
   a dielectric film continuously covering the sidewall and the moat bottom, and extending out of the moat and onto a first portion of the surface of the substrate; and
   a metal contact layer covering a second portion of the surface of the substrate and at least a portion of the dielectric film,
   wherein a recess is defined within the moat between the moat bottom and the surface of the substrate.

2. The semiconductor device assembly of claim 1, wherein the semiconductor device is a rectifier.

3. The semiconductor device assembly of claim 1, wherein the dielectric film includes an oxide layer.

4. The semiconductor device assembly of claim 1, wherein the dielectric film includes a nitride layer.

5. The semiconductor device assembly of claim 1, wherein the dielectric film includes an oxide layer adjacent to the sidewall of the moat portion and to the first portion, and a nitride layer formed on the oxide layer.

6. A semiconductor wafer assembly, comprising:
   a substrate having a plurality of semiconductor devices formed therein;
   at least one moat formed in the substrate and dividing the plurality of semiconductor devices into individual semiconductor devices, the at least one moat having moat sidewalls that are adjacent to at least two of the individual semiconductor devices, and a moat bottom between the sidewalls; and
   a dielectric film continuously covering the moat sidewalls and the moat bottom, and extending out of the moat and onto a portion of a surface of the substrate on a top perimeter of the moat,
   wherein a recess is defined within the moat between the moat bottom and the surface of the substrate.

7. The semiconductor wafer assembly of claim 6, comprising:
   a metal contact layer covering a remaining portion of the surface of the substrate and at least a portion of the dielectric film covering the portion of the surface of the substrate, and providing electrical contact to at least one of the plurality of semiconductor devices.

8. The semiconductor wafer assembly of claim 6, wherein the moat bottom is substantially planar and provides a saw street for cutting the substrate to divide the plurality of semiconductor devices into the individual semiconductor devices.

9. The semiconductor wafer assembly of claim 6, wherein the moat bottom has a width of less than 100 microns.

10. The semiconductor wafer assembly of claim 6, wherein the dielectric film includes an oxide layer.

11. The semiconductor wafer assembly of claim 6, wherein the dielectric film includes a nitride layer.

12. The semiconductor wafer assembly of claim 6, wherein the dielectric film includes an oxide layer adjacent to the sidewall of the moat portion and to the first portion, and a nitride layer formed on the oxide layer.

13. The semiconductor wafer assembly of claim 6, wherein the semiconductor device is an ultrafast rectifier.

14. The semiconductor wafer assembly of claim 6, wherein the dielectric film includes an oxide layer.

15. The semiconductor wafer assembly of claim 6, wherein the dielectric film includes a nitride layer.

16. A semiconductor wafer assembly, comprising:
   a substrate having a plurality of semiconductor devices formed therein;
   at least one moat formed in the substrate and dividing the plurality of semiconductor devices into individual semiconductor devices, the at least one moat having moat sidewalls between at least two of the individual semiconductor devices, and a moat bottom between the sidewalls; and
   a dielectric film continuously covering the moat sidewalls and the moat bottom, the dielectric film extending out of the moat and onto a surface of the substrate adjacent to the moat,
   wherein a recess is defined within the moat between the moat bottom and the surface of the substrate.

17. The semiconductor wafer assembly of claim 16, comprising:
   a metal contact layer covering a portion of the surface of the substrate and at least a portion of the dielectric film, and providing electrical contact to at least one of the plurality of semiconductor devices.

18. The semiconductor wafer assembly of claim 16, wherein the moat bottom is substantially planar and provides a saw street for cutting the substrate to divide the plurality of semiconductor devices into the individual semiconductor devices.

19. The semiconductor wafer assembly of claim 16, wherein the moat bottom has a width of less than 100 microns.

* * * * *